(12) United States Patent
Boernert et al.

(10) Patent No.: US 10,107,884 B2
(45) Date of Patent: Oct. 23, 2018

(54) AUTOMATIC OPTIMIZATION OF PARALLEL IMAGING ACCELERATION PARAMETERS

(71) Applicants: KONINKLIJKE PHILIPS N.V., Eindhoven (NL); PHILIPS GMBH, Hamburg (DE)

(72) Inventors: Peter Boernert, Eindhoven (NL); Michel Paul Jurriaan Jurrissen, Eindhoven (NL); Mariya Ivanova Doneva, Eindhoven (NL); Adrianus Joseph Willibrordus Duijndam, Eindhoven (NL); Kay Nehrke, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 449 days.

(21) Appl. No.: 14/774,187

(22) PCT Filed: Mar. 12, 2014

(86) PCT No.: PCT/IB2014/059667
§ 371 (c)(1),
(2) Date: Sep. 10, 2015

(87) PCT Pub. No.: WO2014/141086
PCT Pub. Date: Sep. 18, 2014

(65) Prior Publication Data
US 2016/0018498 A1    Jan. 21, 2016

Related U.S. Application Data

(60) Provisional application No. 61/778,582, filed on Mar. 13, 2013.

(51) Int. Cl.
*G01V 3/00* (2006.01)
*G01R 33/561* (2006.01)
(Continued)

(52) U.S. Cl.
CPC .... *G01R 33/5611* (2013.01); *G01R 33/34092* (2013.01); *G01R 33/5608* (2013.01)

(58) Field of Classification Search
CPC ............ G01R 33/4824; G01R 33/5608; G01R 33/34092; G01R 33/5611
(Continued)

(56) References Cited

U.S. PATENT DOCUMENTS

| 6,841,998 | B1 | 1/2005 | Griswold |
| 7,394,252 | B1 | 7/2008 | Lin |

(Continued)

FOREIGN PATENT DOCUMENTS

| WO | 2005091011 A1 | 9/2005 |
| WO | 2006003553 A1 | 1/2006 |

OTHER PUBLICATIONS

Jurrissen M, Fuderer M, van den Brink J. "Diamond-Sense: undersampling on a crystallographic grid" In: Proceedings of the 12th Annual Meeting of ISMRM, Kyoto, Japan, 2004. p. 2643.
(Continued)

*Primary Examiner* — Reena Aurora

(57) ABSTRACT

A parallel magnetic resonance imaging system (1) includes at least one radio frequency (RF) coil (10, 12) with a plurality of coil elements, a smart select unit (24), a parallel imaging parameter unit (28), and a sequence control (16). The smart select unit (24), from a pre-scan or prior scan of a subject with the at least one RF coil, constructs (60) a signal map and a plurality of noise maps based on different sets of reduction factors. The parallel imaging parameter unit (28) selects a set of reduction factors corresponding to a noise map which includes a highest signal-to-noise ratio (SNR). The sequence control (16) performs a magnetic resonance imaging scan of the subject based on the selected reduction factors.

19 Claims, 3 Drawing Sheets

Figure 1:
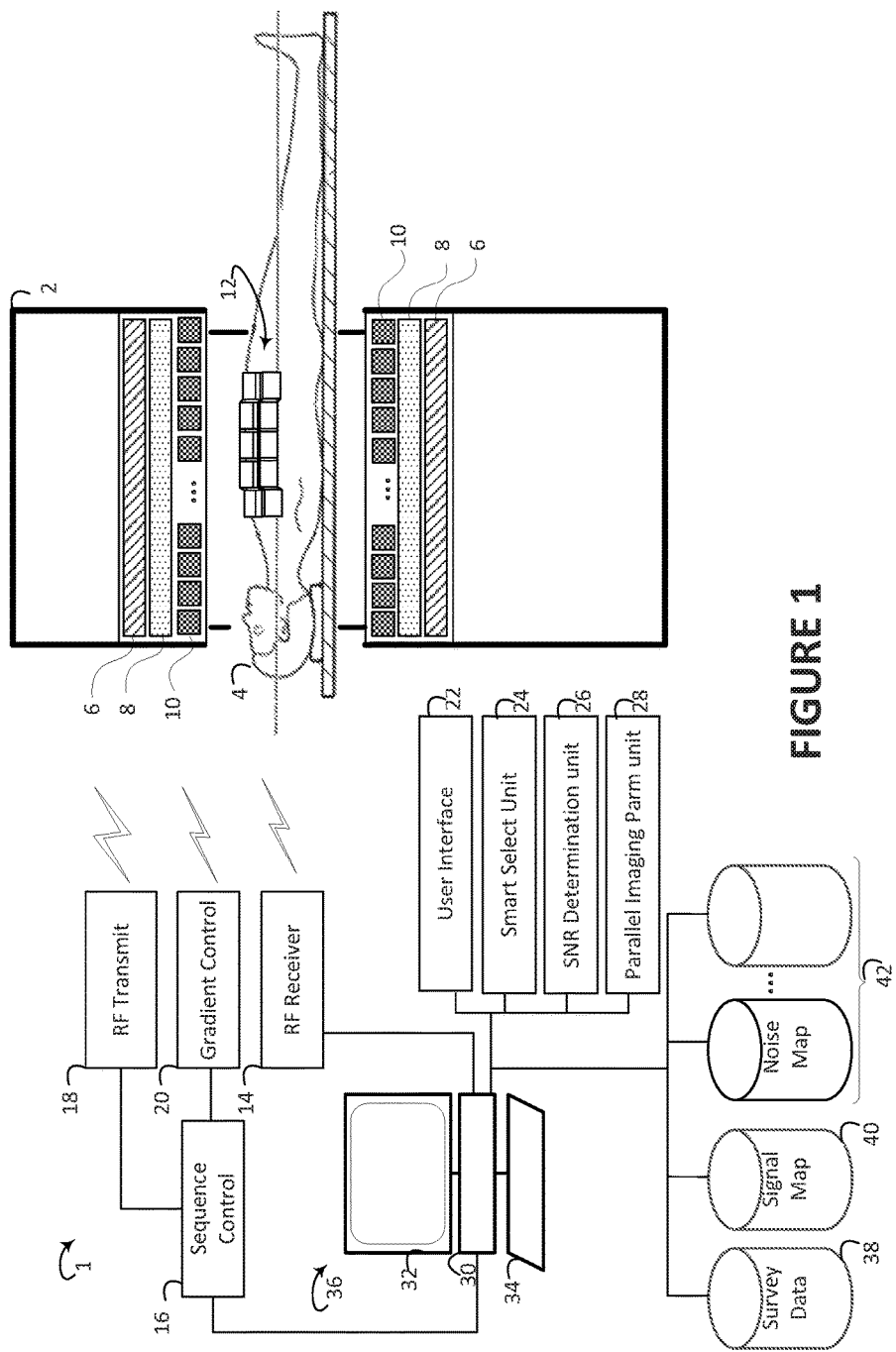

(51) Int. Cl.
*G01R 33/34* (2006.01)
*G01R 33/56* (2006.01)

(58) Field of Classification Search
USPC .......................................................... 324/309
See application file for complete search history.

(56) References Cited

U.S. PATENT DOCUMENTS

| | | |
|---|---|---|
| 7,429,862 B2 | 9/2008 | Kholmovski et al. |
| 8,054,078 B2 | 11/2011 | Ikezaki |
| 2005/0083051 A1 | 4/2005 | Campagna et al. |
| 2011/0148410 A1 | 6/2011 | Zaitsev et al. |

OTHER PUBLICATIONS

Pruessmann et al "SENSE: Sensitivity Encoding for Fast MRI" Magnetic Resonance in Medicine 42: p. 952-962 (1999).
Tsao et al, "k-t BLAST and k-t SENSE: Dynamic MRI With High Frame Rate Exploiting Spatiotemporal Correlations" Magnetic Resonance in Medicine 50: p. 1031-1042 (2003).
Weavers, P. T., Borisch, E. A., Johnson, C. P. and Riederer, S. J. (2014), Acceleration apportionment: A method of improved 2D SENSE acceleration applied to 3D contrast-enhanced MR angiography. Magn Res on Med, 71: 672-680. doi: 10. 1002/mrm. 24 700.

AUTOMATIC OPTIMIZATION OF PARALLEL IMAGING ACCELERATION PARAMETERS

CROSS-REFERENCE TO PRIOR APPLICATIONS

This application is the U.S. National Phase application under 35 U.S.C. § 371 of International Application No. PCT/IB2014/059667, filed on Mar. 12, 2014, which claims the benefit of U.S. Patent Application No. 61/778,582, filed on Mar. 13, 2013. These applications are hereby incorporated by reference herein.

The following relates generally to medical imaging. It finds particular application in conjunction with magnetic resonance imaging, and will be described with particular reference thereto. However, it will be understood that it also finds application in other usage scenarios and is not necessarily limited to the aforementioned application.

In 3-dimensional (3-D) magnetic resonance (MR) scans with parallel imaging or multi-slice scans with parallel imaging in the slice direction, a local and/or whole body coil with multiple coil elements and/or a coil array is used. For example, a whole body coil can include 8, 16, 32, etc. coil elements operating in parallel. The coil elements provide overlapping spatial information used to reconstruct images. The parallel imaging performance differs by direction depending on the geometry of a scan and the design of the coils used in the scan.

For each scan, an operator can select acceleration factors for one or more encoding directions, such as a slice, phase encode, or frequency encode direction. The acceleration factors reduce the time of the scan by reducing the resonance excitation and sampling cycles needed to sample k-space fully. The amount of acceleration is often referred to as reduction factors, where R=1 means no reduction, R=2 means a reduction by a factor of 2, etc. Encoding directions can include, for example, one or more phase encoding directions, read directions, or slice directions. The reduction factor can be a fraction or an integer. For example, reduction factors can include 1, 8/7, 4/3, 1.5, 8/5, 2, 2.5, 8/3, 3, 3.5, 4, etc. A poor or incorrect selection results in a low signal-to-noise-ratio (SNR) and a low SNR results in poor image quality. The poor or incorrect choice of reduction factors is only realized by the operator after the scan is completed and the resulting image is viewed. In addition, the quantity of individual acceleration factors provides a complicated set-up repeated for each scan which makes the system unfriendly and prone to operator mistakes.

Other approaches include selecting an "optimal" set of coil elements to perform a MR scan of a given region of interest. The process of selecting the optimal set of coil elements includes a survey scan or pre-scan which can provide noise information. Alternatively, a prior scan of a subject can provide noise information.

The following discloses a new and improved automatic optimization of parallel acceleration parameters which addresses the above referenced issues, and others.

In accordance with one aspect, a parallel magnetic resonance imaging system includes at least one radio frequency (RF) coil with a plurality of coil elements, a smart select unit, a parallel imaging parameter unit, and a sequence control. The smart select unit, from a pre-scan or prior scan of a subject with the at least one RF coil, constructs a signal map and a plurality of noise maps based on different sets of reduction factors along one or more reduction directions. The parallel imaging parameter unit selects a set of reduction factors corresponding to a noise map which optimizes a signal-to-noise ratio (SNR) and a scanning speed. The sequence control performs a magnetic resonance imaging scan of the subject based on the selected reduction factors.

In accordance with another aspect, a method of parallel magnetic resonance imaging includes constructing a signal map and a plurality of noise maps based on the received overall reduction factor from a pre-scan of a subject, each noise map determined based on different sets of reduction factors along one or more reduction directions. Reduction factors corresponding to a noise map which satisfies signal-to-noise ratio (SNR) criterion and scanning speed criterion are selected. A magnetic resonance imaging scan of the subject is performed based on the selected reduction factors.

In accordance with another aspect, a parallel magnetic resonance imaging system includes at least one RF coil with a plurality of coil elements, a user interface, and one or more processors. The user interface receives at least one of a minimum image quality and/or a maximum time to generate image data. The one or more processors are configured to from a prior scan of a subject with the at least one RF coil, construct a signal map and a plurality of noise maps for each of a plurality reduction factors along one or more reduction directions. The one or more processors are further configured to select reduction factors which generate image data with at least the received minimum image quality and/or within the received maximum time, and causes the imaging system to perform a magnetic resonance imaging scan of the subject based on the selected reduction factors.

One advantage is reduction in number of parameters to be selected.

Another advantage resides in the automatic selection of optimized encoding directions and/or reduction factors based on quantifiable parameters such as an overall reduction factor, a minimum signal-to-noise ratio (SNR), or the like.

Another advantage resides in using information obtained from a conventional coil survey scan which includes coil sensitivity information and patient loading of the coil to optimize the encoding directions and/or reduction factors.

Another advantage resides in the simplification of the user interface.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

FIG. 1 schematically illustrates an embodiment of an automatic optimization of parallel acceleration parameters system.

Figure 2:
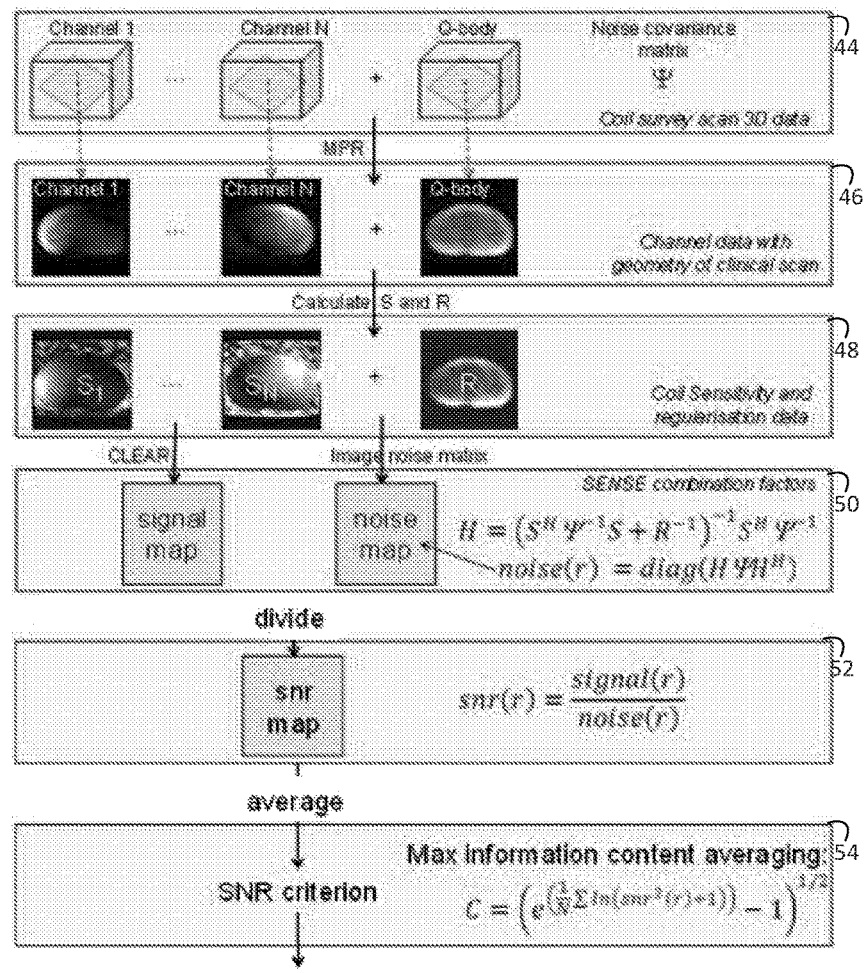

FIG. 2 flowcharts one embodiment of smart select processing.

Figure 3:
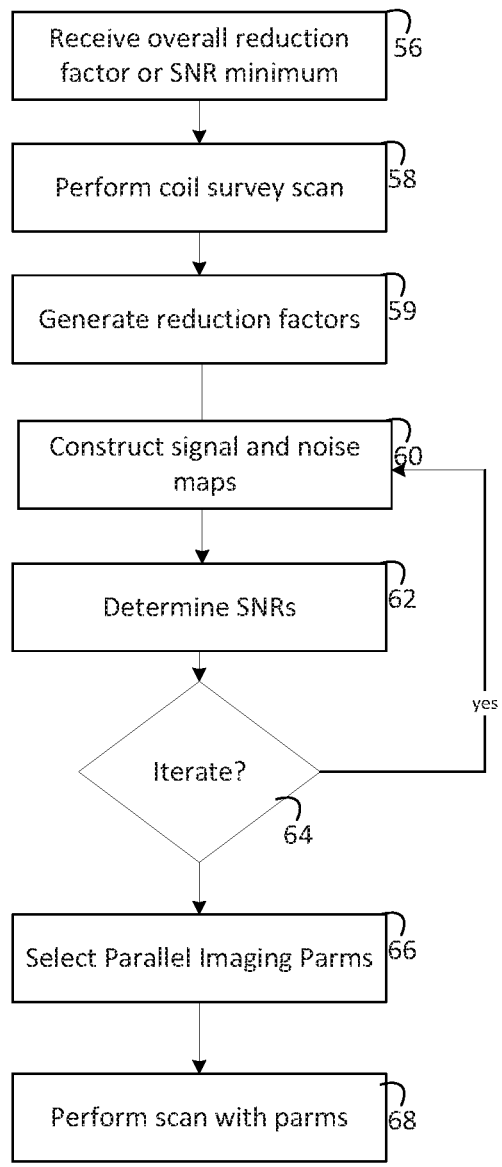

FIG. 3 flowcharts one method of an automatic optimization of parallel acceleration parameters.

With reference to FIG. 1, an embodiment of an automatic optimization of parallel acceleration parameters system 1 is schematically illustrated. The system 1 includes an MR scanner 2 such as a horizontal bore scanner, an open system, a c-type scanner, and the like. The scanner includes an opening or bore that defines an examination region in which a subject 4 is placed for imaging. The MR scanner 2 includes a main magnet 6, one or more gradient coils 8, and a multi-coil element, whole-body radio frequency (RF) coil 10. The main magnet 6 can include superconducting or resistive coils and generates a static $B_0$ field such as a horizontal or vertical static field. The gradient coils apply magnetic field gradients to directionally encode resonance in the tissues of the subject and generate gradient echoes. The directional encoding can define a phase encoding direction, a preparation direction, a slice encoding direction, or the like. In three dimensional (3D) scanning, the gradient coils typically phase encode in two orthogonal directions orthogonal to a read direction rather than defining and reconstructing a stack of 2D images. The scanner 2 can include one or more local RF coils 12 such as a torso coil, head coil, prostate coil, leg coil, etc. The whole-body RF coils 8 and/or the local RF coil 12 include at least one coil with multiple coil elements or a coil array which provides parallel imaging based on a parallel imaging technique such as sensitivity encoding (SENSE). The whole body RF coil and/or local RF coil generate RF pulses which induce and manipulate magnetic resonance in the tissues of the subject 4. The whole-body RF coil and/or local coils receive RF signals from the resonance decay as magnetic resonance data, which are communicated to the RF receiver 14. The coil elements or arrays can transmit or receive individually or in selectable groups to provide a selected transmit and/or receive reduction factor.

The system 1 includes a sequence controller 16 which controls the operation of a imaging scan such as a T1 scan, T2* scan, etc., or a pre-scan and/or a coil survey scan. The coil survey scan or pre-scan can include, for example, a gradient echo or fast field echo (FFE) sequence. The coil survey scan or pre-scan uses a Cartesian or hexagonal sampling of k-space. In one embodiment, the sampling can include compressed parallel or sensing sampling of k-space. The sequence controller 16 controls a RF transmitter unit 18 controlling the operation of the whole-body RF coil 10 and/or local RF coil 12, and a gradient controller 20 controlling the operation of the gradient coils 8. The RF transmitter unit 18 is arranged to drive the coil elements or arrays independently, such as with a plurality of transmitters. The communication between the controlling unit and the corresponding coils can be wireless or wired.

The system 1 includes a user interface 22, a smart select unit 24, a signal-to-noise ratio (SNR) determination unit 26, and a parallel imaging parameter unit 28. The user interface is suitably embodied in a workstation 36 configured to interact with a healthcare practitioner or operator of the scanner 2, such as to receive an overall reduction factor, a minimum SNR, a maximum scan time, and the like, to display acceleration factors for review by the operator, etc. The workstation 36 includes an electronic processor or electronic processing device 30, a display device 32, and at least one input device 34. The display device 32 displays menus, panels, and user controls, and the input device 34 receives input from a healthcare practitioner including an overall reduction or acceleration factor or a minimum SNR. The input device also receives commands to begin the pre-scan or coil survey scan. The workstation 36 can be a desktop computer, a laptop, a tablet, a mobile computing device, a smartphone, and the like. The display device 30 can include a computer monitor, a touch screen, Cathode ray tube (CRT), Storage tube, Flat panel display, Light-emitting diode (LED) displays, Electroluminescent display (ELD), Plasma display panels (PDP), Liquid crystal display (LCD), Organic light-emitting diode displays (OLED), a projector, and the like. The input device 32 can be a keyboard, a mouse, a microphone, and the like.

The smart select unit 24 receives the coil survey data from the RF receiver 14 and stores the survey data in a memory 38. The memory can be a computer memory such as random access memory (RAM), or disk storage such as a hard disk, disk array, solid state memory, and the like. The smart select unit generates a plurality of reduction factors which satisfy the received overall reduction factor and/or minimum SNR. The reduction factors include the phase encoding. For example, an overall reduction factor of 4 can include reduction factors of (4×1), (3.5×8/7), (2.5×8/5), (2×2), (1.5×8/3), (1×4), etc. The product of the reduction factors for the encoded directions approximate the value of the overall reduction factor. The values are discrete values based on a coarse grid which can be further refined in an iteration. The smart select unit constructs a signal map 40, and a plurality of noise maps 42.

The SNR determination unit calculates the SNR for different parallel reduction factors in different directions. The SNR is determined by dividing the signal map by one of the noise maps which provides a SNR value for each voxel. The SNR is determined by an average for the volume, such as $$\left(e^{\left(\frac{1}{N}\sum ln(snr^2(r)+1)\right)} - 1\right)^{1/2}$$

where N is the number of voxels, and snr(r) is the signal-to-noise ratio (SNR) for the $r^{th}$ voxel. Other methods of computing an average SNR or getting a criterion from a noise map are contemplated. In one embodiment, the average can include only those voxels in a region of interest.

The parallel imaging parameter unit 28 selects the reduction factors and directions which satisfy the received overall reduction factor with the highest acceptable SNR. The reduction factors are for the encoded directions used to construct the noise map with the highest SNR. The parallel imaging parameter unit can supply the selected reduction factors for further refinement with smaller steps or smaller incremental discrete values around the selected reduction factors to the smart select unit in iteration. In another embodiment, the reduction factor is spread between the encoding directions in discrete steps and further refined around the highest SNR in smaller steps.

The user interface can display the SNR values as a contrasted image, the average SNR value for each reduction factor set, and/or the highest SNR. The user interface supplies the selected reduction factors to the sequence control to perform a magnetic resonance imaging scan of the subject based on the selected reduction factors and/or encoded directions. The scan can include a Cartesian, hexagonal, or compressed sensing sampling of k-space.

The various units or modules 22, 24, 26 and 28 are suitably embodied by an electronic data processing device, such as the electronic processor or electronic processing device 30 of the workstation 36, or by a network-based server computer operatively connected with the workstation 36 by a network, or so forth. Moreover, the disclosed user interface, signal and noise map construction, and parameter selection techniques are suitably implemented using a non-transitory storage medium storing instructions (e.g., software) readable by an electronic data processing device and executable by the electronic data processing device to perform the disclosed techniques.

With reference to FIG. 2, one embodiment of smart select processing is flowcharted. Briefly summarized, the SENSE reduction factor in each direction is automatically calculated. A pre-scan determines the noisiness of each coil element or group of coil elements. The SNR for each voxel is computed for different directions with different SENSE reduction factors. The operator can specify the overall reduction factor, and the system tells the operator the SNR penalty for the selected SENSE factor. Alternatively, the operator specifies the maximum acceptable SNR and the system selected the reduction factors. Looking at the method in greater detail, a step or unit 44, performs a pre-scan or coil survey scan which receives data from a plurality N of data channels and Q-body data. Each channel corresponds to one (or more) coil element(s). A noise covariance matrix $\Psi$ is constructed from the received data.

A step or unit performs 46 a multi-planar reformatting on the received data which reformats the data into oblique slices with the geometry of the clinical scan. A step or unit 48 calculates the coil sensitivity and regularization data to determine sensitivity in a portion of the imaging volume occupied by the patient of the region of interest.

A signal map and a noise map are constructed by a step or unit 50 from the coil sensitivity data and regularization data. The signal map is the same for each set of reduction factors while the noise map varies based on the reduction factors. The construction of a noise map is repeated with different reduction factors to identify a direction with an optimum SNR. In one embodiment, the noise map is calculated using a matrix $H=(S^H\Psi^{-1}S+R^{-1})^{-1} S^H \Psi^{-1}$ where S in the coil sensitivity map, R is the map of maximal expected MR signal in the image volume occupied by the patient or region of interest, and $\Psi$ is the covariance matrix. The noise(r) is calculated as diag $(H\Psi H^H)$.

The signal map is divided by the noise map by a step or unit 52 which creates an SNR map. The SNR map includes a SNR value for each voxel. A step or unit 54, calculates an average or other criterion of the SNR map, such as $$\left( e^{\left(\frac{1}{N}\sum ln(snr^2(r)+1)\right)} - 1 \right)^{1/2}$$

where N is the number of voxels, and snr(r) is the signal-to-noise ratio (SNR) for the $r^{th}$ voxel. The average SNR of all voxels corresponding to a noise map is used to determine the highest SNR of each noise map as discussed in reference to FIG. 1. Based on this information, the reduction factors which include a reduction factor per each direction are determined and the operator can select the optimal balance between image quality (SNR) and imaging speed (reduction factor).

FIG. 3 flowcharts one method of an automatic optimization of parallel acceleration parameters, such as acceleration factors along the reduction directions, that can be implemented by one or more processors or discrete units or modules. In a step 56, an overall reduction factor or SNR minimum is received by the user interface. In a step 58, a coil survey scan such as a fast field echo (FFE) scan is performed. The coil survey can be performed with Cartesian, hexagonal, or compressed sensing sampling of k-space. Alternatively, a prior scan is performed.

In a step 59, a plurality of reduction factors are generated which satisfy the received overall reduction factor. The overall reduction factor can be based on a minimum SNR. For example, with an overall reduction factor of 4, sets of (4, 1), (3.5, 8/7), (3, 4/3), etc. satisfy the overall reduction factor of 4. The reduction factors accelerate the scan time or reduce the sampling of k-space. The reduction factors include a reduction factor for two encoding directions. In one embodiment the generated sets of reduction factors include a coarse grid or discrete values which can be further refined in smaller increments based on an initial highest SNR of the coarse values.

A signal map and a plurality of noise maps are constructed in a step 60. The step includes the processing as described in reference to FIG. 2. The signal map and noise maps are constructed in a step 60 for the sets of generated reduction factors and/or based on the minimum SNR. Continuing the smart select processing as described with reference to FIG. 2, a SNR is determined for each voxel of each noise map based on the set of reduction factors in a step 62. The SNR is calculated by the division of the signal map by the noise map. The average SNR over the object of interest or the whole imaging volume is also calculated.

In a decision step 64, an iteration is performed which repeats the construction of the noise maps, and SNR determination with smaller increments of reduction factors about the initial highest SNR and corresponding reduction factors.

Reductions factors are selected in a step 66 based on the highest SNR of the corresponding noise map. The search for reduction factors less than the overall reduction factor is along the reduction directions. In a step 68, a magnetic resonance imaging scan is performed with the selected reduction factors. The scan can be performed, for example, with SENSE sampling of k-space, compressed with the selected reduction factors.

In accordance with certain exemplary embodiments of the present invention, the exemplary MR system can optimize the SENSE performance as a function of the SENSE factors and the sampling approach scheme for the given imaging geometry, object extent, receive coil configuration and/or additional information that is available at the beginning, by a fast evaluation of the error propagation, essentially performing a relatively low-resolution G-factor evaluation. The SENSE scan parameters employed form a parameter space. These parameters can be presented to the user via the Exam-parameters, for example. Based on the available information, the exemplary MR-system can determine an optimal (or best) parameter set, or it can meet some predefined Exam-parameter specific constraints (e.g., SNR loss, G-factor distribution/statistics, special region of interests (ROI), etc.) by changing specific SENSE parameters to something useful. It is also possible to inform the user about the consequences of his/her choices and provide options to resolve problems.

Final image quality is obtained through an optimal sensitivity encoding process and good conditioning of the unfolding problem (G-factor (1)). The SENSE problem for a single position in the reduced FOV can be considered for example as Sx=y.

In this example, the N unknown voxel signal contributions, from the different locations, that fall onto each other (folding due to uniform k-space under-sampling) can be summarized in vector x. The received signal is sensitivity encoded and measured with the M receive coils (M≥N). Their corresponding signals are grouped in vector y. The matrix S denotes the (N×M) sensitivity matrix. The chosen reduction factor R (Rtotal=R1+R2 in case of 2D SENSE) and the chosen k-space specific sub-sampling scheme define which voxels out of the full FOV will fold onto each other being appropriately sensitivity encoded during the measuring process. This means that the actual form of Sx=y depends on the chosen experimental parameters, which should be summarized in the vector Δ.

Inverting this matrix in Sx=y yields the vector x, which contains the corresponding N voxel specific signals. E.g., $[[(S)\hat{\ }H\ S)]\hat{\ }(-1)\ S]\hat{\ }H\ y=x$.

The matrix $[[[(S)\hat{\ }H\ S)]\hat{\ }(-1)\ S]\hat{\ }H$ is the pseudo-inverse of S and its norm describes the error propagation from the measurements into the final image. One potential norm, the g-factor, can give a normalized measure for a good numerical condition. E.g., $g=\sqrt{([[(S\hat{\ }H\ S)]\hat{\ }(-1))\ [(S\hat{\ }H\ S)]\hat{\ }]} \geq 1$ The g-factor depends on the matrix S which depends on the chosen sampling parameters Δ. Thus, the g-factor can be used to judge if the chosen SENSE Exam-parameters Δ (R1, R2, diamond sampling pattern, tec.) are optimal or if they should be chosen differently to do better. To do this, one has to minimize g, among all possible settings Δ. However, $g=\sqrt{([[(S\hat{\ }H\ S)]\hat{\ }(-1))\ [(S\hat{\ }H\ S)]\hat{\ }]} \geq 1$ describes only one voxel in the reduced FOV, and a compromise for almost all voxels in the reduced FOV (in a 2D imaging case: matrix L×K, in 3D an even higher dimension) has to be found. This could be numerically challenging and the evaluation could be hidden in the background, but a number of measures for acceleration are conceivable.

The size of the problem can be reduced if not all L×K voxels in the rFOV are used to optimize the Δ parameters. For this purpose, the reduced FOV can be uniformly or randomly "under-sampled" (low-resolution approach) reducing thus the number of g-factor elements to be considered. This also implies that the coil sensitivities are rather smooth functions in space. Additionally the evaluation can further be concentrated on important areas in the image that are of particular clinical interest (ROI).

A second approach to reduce the size of the problem is to transform all involved coils in a virtual coil system (using SVD or similar approaches). Thus, only the N significant coils have to be considered in this evaluation.

However, calculating directly $S\hat{\ }H\ S$ for each location using all coils, as an element of the basic calculation of the pseudo-inverse, is also efficient and avoids neglecting parts of the coil information.

Or an even simpler norm could be employed for evaluation instead of $g=\sqrt{([[(S\hat{\ }H\ S)]\hat{\ }(-1))\ [(S\hat{\ }H\ S)]\hat{\ }]} \geq 1$.

Statistical processes can be applied to analyze the g-factors distribution in the reduced FOV to allow comparisons of different parameter sets Δ. Furthermore, the search for the optimal Δ can be performed in a hierarchical manner, starting form a coarse resolution in the Δ space and in the rFOV space, which can be adapted/increased during the optimization progress.

Additional information that can be typically applied in the SENSE unfolding (noise correlation matrix, regularization image, or in the simplest case a binary mask restricting the coil sensitivities to areas from which signal is expected) can also be included in the computation of the g-factors in the optimization.

Furthermore, information about the structure of the encoding problem can be incorporated. This can be especially interesting in, e.g., k-t SENSE applications in which a training data set can be used for unfolding. If this information is available already before the measurement, either as a rough estimate (e.g., from a library) or from a measured model, this can be used as an additional input into the selection of appropriate k-t sampling schemes and reduction factors which are dedicated to this patient or imaging problem.

For example, a 3D FFE scan with a fixed acceleration factor (R total=4) is performed using a given array coil. This could be due to a clinical requirement to ensure that the scan is shorter than 20 seconds, for example. A user defines the scan geometry and the read-out direction and the final imaging matrix and R total. Given to these constraints and the SENSE reference scan information, the scanner decides which potential under-sampling factors R1 and R2 and which sampling scheme should be used. To make this decision without the help of a system can be complicated. In contrast, in accordance with exemplary embodiments of the present invention, it is possible to that this decision is provided by the system, increasing user friendliness and simplicity while helping to improve image quality.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A magnetic resonance imaging system, comprising:
a user interface configured to receive a user input from a medical professional, the user input corresponding to one of a maximum imaging time, an overall reduction factor, or a minimum signal-to-noise ratio;
at least one radio frequency coil with a plurality of coil elements configured to perform a scan of a subject; and
at least one electronic processor programmed to:
generate a plurality of sets of reduction factors along corresponding reduction directions from the received one of the maximum imaging time, the overall reduction factor, or the minimum signal-to-noise ratio, wherein the reduction directions correspond to at least one encoded direction;
construct a signal map from the scan of the subject and a plurality of noise maps corresponding to the sets of reduction factors from the scan of the subject and the sets of reduction factors, wherein at least one of the noise maps optimizes signal-to-noise ratio and scanning speed;
select one of the sets of reduction factors corresponding to one of the noise maps that optimizes the signal-to-noise ratio and the scanning speed;
perform a magnetic resonance imaging scan of the subject based on the selected reduction factors.

2. The system according to claim 1, wherein the set of reduction factors includes two reduction factors for two reduction directions.

3. The system according to claim 1, wherein the set of reduction factors include a plurality of reduction factors, each reduction factor corresponding to the encoded direction.

4. The system according to claim 1, wherein a parallel imaging parameter unit selects the overall reduction factor which minimize imaging time to generate images with at least the received minimum signal-to-noise ratio.

5. The system according to claim 1, wherein the selection of reduction factors includes a search along each encoded direction.

6. The system according to claim 1, wherein a smart select unit is configured to:
construct a set of 3-dimensional data from the prior scan;
perform multi-planar reformatting of the 3-dimensional data to determine channel with a geometry of the imaging scan;
calculate coil sensitivity and regularization data based on the determined channel data; and
generate a signal map and a noise map based on the determined coil sensitivity and regularization data.

7. The system according to claim 1, wherein the highest SNR includes an average SNR of all voxels.

8. The system according to claim 1, wherein the at least one electronic processor is programmed to select one of the sets of reduction factors corresponding to one of the noise maps corresponding to the minimum signal-to-noise ratio and a scanning speed by:
calculating the signal-to-noise ratio by dividing the signal map by one of the noise maps based on the different reduction factors along the one or more reduction directions.

9. A method of parallel magnetic resonance imaging, comprising:
with a user interface, receiving a user input from a medical professional, the user input corresponding to one of a maximum imaging time, an overall reduction factor, or a minimum signal-to-noise ratio;
with at least one electronic processor:
generating one of a plurality of sets of reduction directions based on the received maximum imaging time, the received overall reduction factor, or on the overall reduction factor which meets the received signal-to-noise ratio, wherein the reduction directions correspond to at least one or more encoded directions;
constructing a signal map from a prior scan of a subject and a plurality of noise maps from the prior scan of a subject and the generated reduction directions;
selecting reduction factors corresponding to one of the noise maps which satisfies a signal-to-noise ratio criterion calculated by dividing the signal map by the noise map and a scanning speed criterion; and
performing a magnetic resonance imaging scan of the subject based on the selected reduction factors.

10. The method according to claim 9, wherein selecting the reduction factors includes selecting two reduction factors, each reduction factor for a reduction direction.

11. The method according to claim 9, wherein each set of reductions factors includes a plurality of reduction factors, each reduction factor corresponding to an encoding direction.

12. The method according to claim 9, further including:
selecting the reduction factors and/or reduction directions which minimize imaging time to generate images which at least meet the received minimum signal-to-noise ratio criterion.

13. The method according to claim 9, further including:
searching the reduction factors along each encoding direction in discrete steps; and
refining the reduction factor search around the highest signal-to-noise ratio in smaller steps.

14. The method according to claim 9, further including:
constructing a set of 3-dimensional data from the prior scan;
performing multi-planar reformatting of the 3D data to determine channel with a geometry of the imaging scan;
calculating coil sensitivity and regularization data based on the determined channel data; and
generating a signal map and a noise map based on the determined coil sensitivity and regularization data.

15. A non-transitory computer-readable storage medium carrying software which controls one or more electronic data processing devices to perform the method according to claim 9.

16. An electronic data processing device configured to perform the method according to claim 9.

17. The method according to claim 9, wherein the method further includes: with the at least one electronic processor:
calculating the signal-to-noise ratio by dividing the signal map by one of the noise maps based on the different reduction factors along the one or more reduction directions.

18. A parallel magnetic resonance imaging system, comprising:
at least one RF coil with a plurality of coil elements;
a user interface configured to receive at least one of a minimum image quality and/or a maximum time to generate image data;
one or more processors programmed to:
generate a plurality of reduction factors along one or more reduction directions from the received minimum image quality or the received maximum time to generate image data, wherein the reduction directions correspond to at least one encoded direction;
construct a signal map and a plurality of noise maps for each of the plurality reduction factors from a prior scan of a subject using the at least one radio frequency coil;
select reduction factors which generate image data with at least the received minimum image quality and/or within the received maximum time;
control the imaging system in order to perform a magnetic resonance imaging scan of the subject based on the selected reduction factors.

19. A magnetic resonance imaging system, comprising:
a user interface which receives a minimum signal-to-noise ratio;
at least one radio frequency coil with a plurality of coil elements;
at least one electronic processor programmed to:
generate an overall reduction factor which meets the received minimum signal-to-noise ratio and different sets of reduction factors along one or more reduction directions, wherein the reduction directions correspond to at least one encoded direction;
construct a signal map and a plurality of noise maps from a prior scan of a subject, the prior scan using the at least one radio frequency oil, and the different sets of reduction factors;
select a set of reduction factors corresponding to a noise map which matches the received signal-to-noise ratio and a scanning speed, wherein the signal-to-noise ratio is calculated by dividing the signal map by one of the noise maps based on the different reduction factors along the one or more reduction directions;
perform a magnetic resonance imaging scan of the subject based on the selected reduction factors.

* * * * *